(12) United States Patent
Cheng et al.

(10) Patent No.: US 7,618,872 B2
(45) Date of Patent: Nov. 17, 2009

(54) SEMICONDUCTOR DEVICE STRUCTURES FOR BIPOLAR JUNCTION TRANSISTORS AND METHODS OF FABRICATING SUCH STRUCTURES

(75) Inventors: Kangguo Cheng, Guilderland, NY (US); Louis Lu-Chen Hsu, Fishkill, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/125,342

(22) Filed: May 22, 2008

(65) Prior Publication Data

US 2008/0220583 A1 Sep. 11, 2008

Related U.S. Application Data

(62) Division of application No. 11/427,982, filed on Jun. 30, 2006, now Pat. No. 7,482,672.

(51) Int. Cl.
*H01L 21/331* (2006.01)
(52) U.S. Cl. ................. 438/311; 257/571; 257/E29.033
(58) Field of Classification Search ................. 438/311; 257/571, 586, E29.033
See application file for complete search history.

(56) References Cited

U.S. PATENT DOCUMENTS

| 5,087,580 | A | | 2/1992 | Eklund |
| 5,217,700 | A | | 6/1993 | Kurihara et al. |
| 5,313,090 | A | | 5/1994 | Morikawa |
| 5,554,543 | A | | 9/1996 | Yang |
| 5,767,578 | A | * | 6/1998 | Chang et al. ................. 257/717 |
| 6,638,807 | B2 | | 10/2003 | Forbes et al. |
| 7,202,132 | B2 | * | 4/2007 | Zhu et al. .................... 438/300 |
| 7,205,601 | B2 | | 4/2007 | Lee et al. |
| 7,285,469 | B2 | * | 10/2007 | Beasom ...................... 438/309 |
| 2004/0046233 | A1 | | 3/2004 | Swanson et al. |

OTHER PUBLICATIONS

Office Action; dated as mailed on Jan. 14, 2009 for U.S. Appl. No. 12/130,176; 5 pages; U.S. Patent and Trademark Office.
Harame, et al., "Si/SiGe Epitaxial-Base Transistors—Part II: Process Integration and Analog Applications", IEEE Transactions on Electron Devices, vol. 42, No. 3, Mar. 1995, pp. 469-482.

(Continued)

*Primary Examiner*—Allan R. Wilson
(74) *Attorney, Agent, or Firm*—Wood, Herron & Evans, LLP

(57) ABSTRACT

Semiconductor device structures for use with bipolar junction transistors and methods of fabricating such semiconductor device structures. The semiconductor device structure comprises a semiconductor body having a top surface and sidewalls extending from the top surface to an insulating layer, a first region including a first semiconductor material with a first conductivity type, and a second region including a second semiconductor material with a second conductivity type. The first and second regions each extend across the top surface and the sidewalls of the semiconductor body. The device structure further comprises a junction defined between the first and second regions and extending across the top surface and the sidewalls of the semiconductor body.

10 Claims, 16 Drawing Sheets

OTHER PUBLICATIONS

Nesbit, et al., A 0.6 um2 256Mb Trench DRAM Cell With Self-Aligned BuriEd STrap (BEST), 1993 IEDM Technical Digest, pp. 627-630.

Sato, et al., "A 0.18-um RF SiGe BiCMOS Technology With Collector-Epi-Free Double-Poly Self-Aligned HBTs", IEEE Transactions on Electron Devices, vol. 50, No. 3, Mar. 2003, pp. 669-675.

* cited by examiner

US 7,618,872 B2

SEMICONDUCTOR DEVICE STRUCTURES FOR BIPOLAR JUNCTION TRANSISTORS AND METHODS OF FABRICATING SUCH STRUCTURES

CROSS-REFERENCE TO RELATED APPLICATIONS

This application is a divisional of application Ser. No. 11/427,982, filed Jun. 30, 2006, which is hereby incorporated by reference herein in its entirety.

FIELD OF THE INVENTION

The invention relates generally to semiconductor device structures and fabrication methods and, in particular, to semiconductor device structures for use in constructing bipolar junction transistors and methods of fabricating such semiconductor device structures.

BACKGROUND OF THE INVENTION

Transistors are semiconductor devices in which the current flowing between two device regions is controlled or modulated by an applied voltage. Transistors may be categorized as either field effect transistors (FET's) or bipolar junction transistors (BJT's). Bipolar junction transistors are active semiconductor devices formed by a pair of P-N junctions, namely an emitter-base junction and a collector-base junction. An NPN bipolar junction transistor has a thin region of P-type material constituting the base region between two regions of N-type material constituting the emitter and collector regions. A PNP bipolar junction transistor has a thin region of N-type material constituting the base region between two regions of P-type material constituting the emitter and collector regions. The movement of electrical charge carriers that produces electrical current flow between the collector region and the emitter region is controlled by a voltage applied across the emitter-base junction.

Conventional bipolar junction transistors are fabricated with a vertical arrangement of the emitter, base, and collector regions in which these regions have a stacked planar construction formed on a planar surface. As a result, conventional bipolar junction transistors have a relatively large footprint that consumes a significant surface area of the active device layer. The device footprint cannot be reduced because the area of the emitter-base junction cannot be easily scaled. Consequently, the emitter-base junction in planar device designs is limited by the planar surface area.

What is needed, therefore, are semiconductor device structures for bipolar junction transistors and fabrication methods that overcome these and other disadvantages of conventional semiconductor device structures for bipolar junction transistors and methods of manufacturing such semiconductor device structures.

SUMMARY OF THE INVENTION

The present invention is directed to semiconductor device structures and fabrication methods for bipolar junction transistors. The present invention overcomes the problems associated with conventional processes for manufacturing bipolar junction transistors and improves circuit packing density, circuit performance, and thermal dissipation. The fabrication method of the present invention may be readily integrated with complementary metal-oxide-semiconductor (CMOS) bulk, semiconductor-on-insulator (SOI), or fin-type field effect transistor (FinFET) technologies.

In accordance with an aspect of the present invention, a semiconductor device structure comprises a semiconductor body having a top surface and sidewalls extending from the top surface toward an insulating layer. The structure further includes a first region including a first semiconductor material with a first conductivity type and a second region including a second semiconductor material with a second conductivity type. The first and second regions are disposed on the top surface and the sidewalls of the semiconductor body with an at least partially overlapping relationship to define a first junction extending between the first and second regions adjacent toward the top surface and the sidewalls of the semiconductor body. In certain specific embodiments, the first region may comprise an emitter region of a bipolar junction transistor and the second region may comprise a base region of the bipolar junction transistor so that the junction is an emitter-base junction. In other specific embodiments, the first region may comprise a collector region of a bipolar junction transistor and the second region may comprise a base region of the bipolar junction transistor so that the junction is a collector-base junction.

In accordance with another aspect of the present invention, a method is provided for fabricating a semiconductor device structure. The method comprises forming a semiconductor body having a top surface and sidewalls extending from the top surface toward the insulating layer, and forming a first region of a first semiconductor material with a first conductivity type that is disposed on the top surface and the sidewalls of the semiconductor body. The method further comprises forming a second region of a second semiconductor material with a second conductivity type that is at least partially coextensive with the first region to define a first junction extending between the first and second regions adjacent to the top surface and the sidewalls of the semiconductor body.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1A:
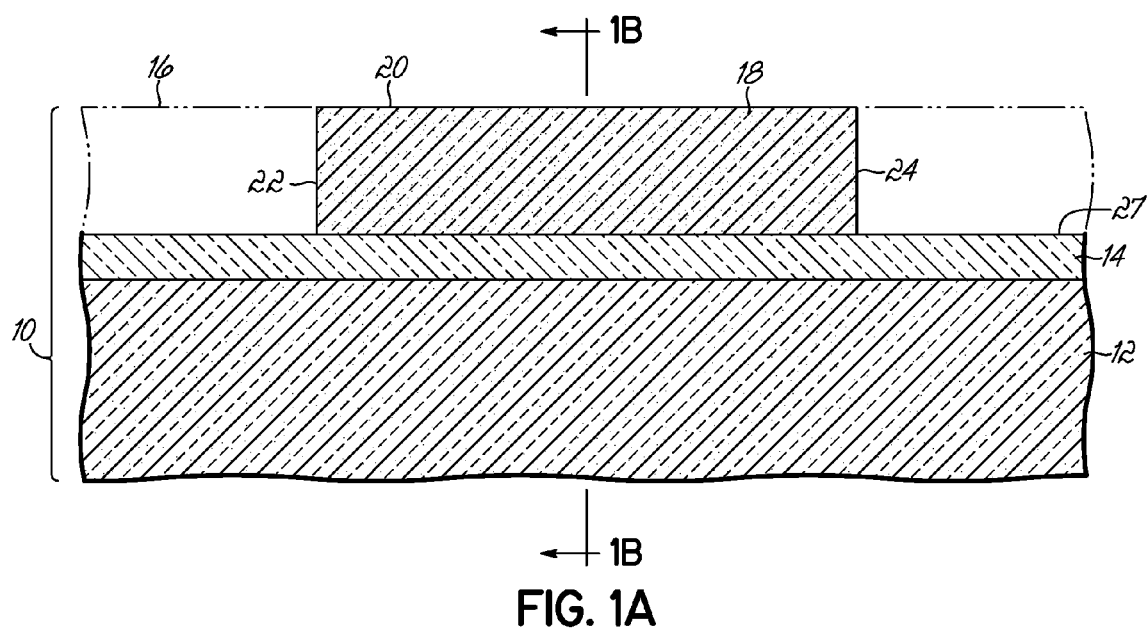
FIGS. 1-14 are diagrammatic views of a portion of a substrate at successive fabrication stages of a processing method in accordance with an embodiment of the present invention in which A represents a cross-sectional view and B is a corresponding cross-sectional view taken generally along lines B-B in A.
Figure 1B:
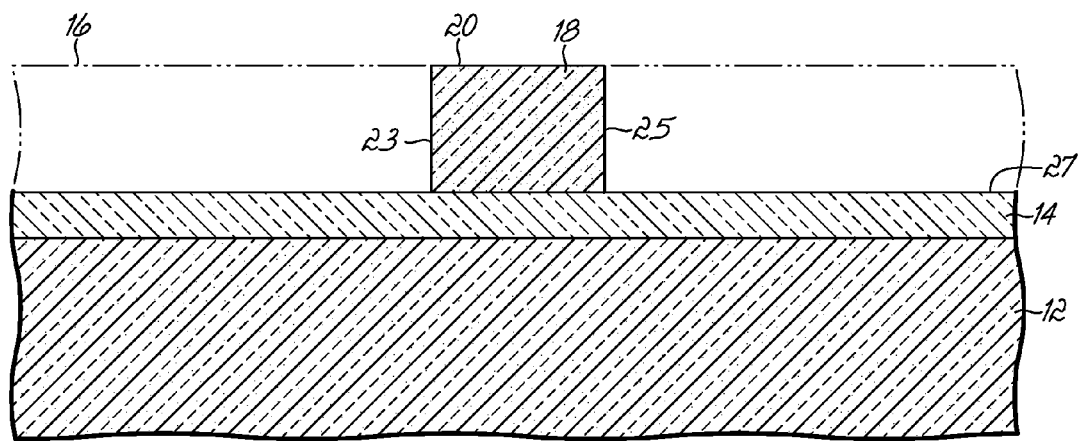

With reference to FIGS. 1A and 1B, a bipolar junction transistor 72 (FIGS. 13A, 13B) is fabricated using an SOI wafer 10 comprising a handle substrate 12, a buried insulating layer 14, and a semiconductor or SOI layer 16 physically separated from the handle substrate 12 by the intervening buried insulating layer 14. The handle substrate 12 may be single crystal or monocrystalline silicon, although the invention is not so limited. The SOI layer 16 is considerably thinner than the handle substrate 12 and may be advantageously composed of single crystal or monocrystalline silicon. The buried insulating layer 14 electrically isolates the SOI layer 16 from the handle substrate 12. The buried insulating layer 14 may consist of a buried silicon dioxide (BOX) layer. SOI wafer 10 may be fabricated by any suitable conventional technique, such as a wafer bonding technique or a separation by implantation of oxygen (SIMOX) technique, familiar to a person having ordinary skill in the art.

The semiconductor material of SOI layer 16 is patterned by a conventional lithography and subtractive etching process to define a plurality of semiconductor mesas or fin structures, of which fin structure 18 is visible in FIGS. 1A, 1B, that are mutually electrically isolated from each other by regions of the buried insulating layer 14. The fin structure 18 represents a thin upright body of the semiconductor material originally constituting SOI layer 16 and, thus, has a "fin" type shape. The fin structure 18 has a top surface 20 and a plurality of sidewalls, of which laterally opposite sidewalls 22, 24 are visible in FIG. 1A and laterally opposite sidewalls 23, 25 are visible in FIG. 1B. Each of the sidewalls 22, 23, 24, 25 extends from the top surface 20 toward a top surface 27 of the buried insulating layer 14. The sidewalls 22, 23, 24, 25 may be tapered or flared, as opposed to the vertical construction shown in FIGS. 1A, 1B. The height of each fin structure 18, which is measured as the perpendicular distance between the top surfaces 20, 27, typically ranges from about 30 nm to about 300 nm; the width of each fin structure 18 typically ranges from about 10 nm to about 100 nm. Optionally and before the formation of fin structure 18, the SOI layer 16 may be thickened by epitaxial growth of the constituent semiconductor material (e.g., silicon).

The fin structure 18 is uniformly doped by ion implantation with a dose of an appropriate impurity. A subsequent thermal anneal may be required to electrically activate and/or distribute the implanted impurity in the semiconductor material of the fin structure 18. The impurity implanted to dope the semiconductor material of the fin structure 18 may have, for example, an n-conductivity type (e.g., arsenic). Generally, the resultant dopant concentration in the fin structure 18 may range from about $1\times10^{18}$ cm$^{-3}$ to about $1\times10^{20}$ cm$^{-3}$. Other alternative techniques, such as gas phase doping and solid source doping, may be employed to dope the semiconductor material of the fin structure 18.

Figure 2A:
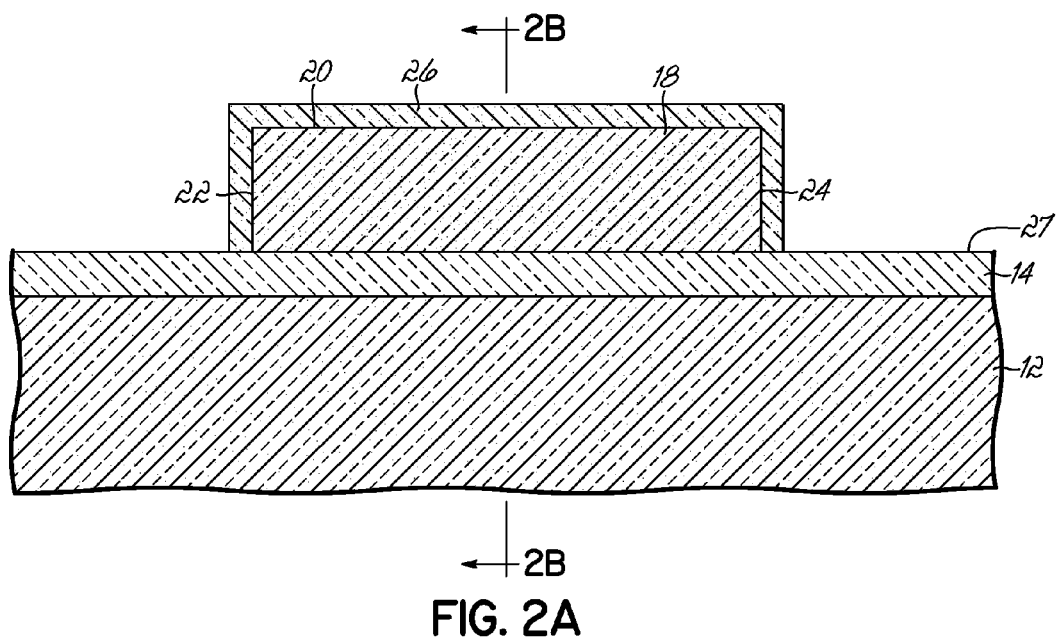
Figure 2B:
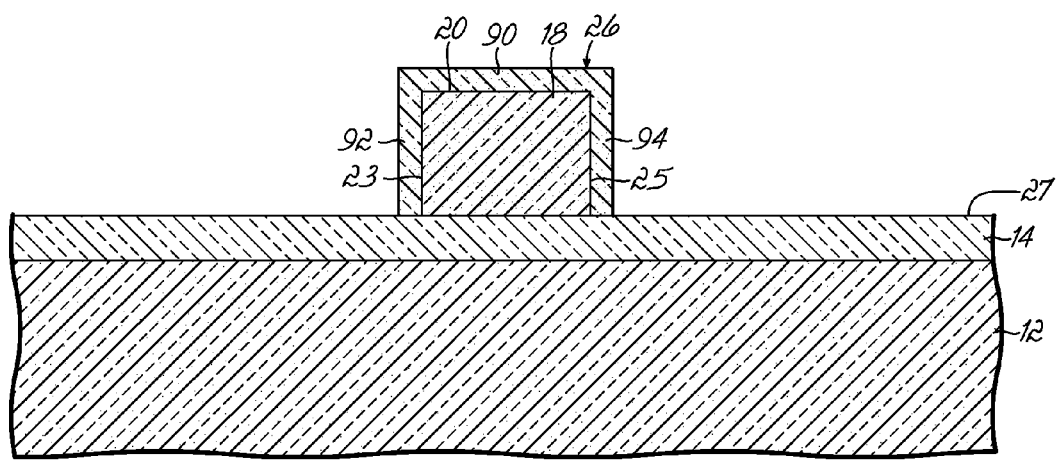
Figure 5A:
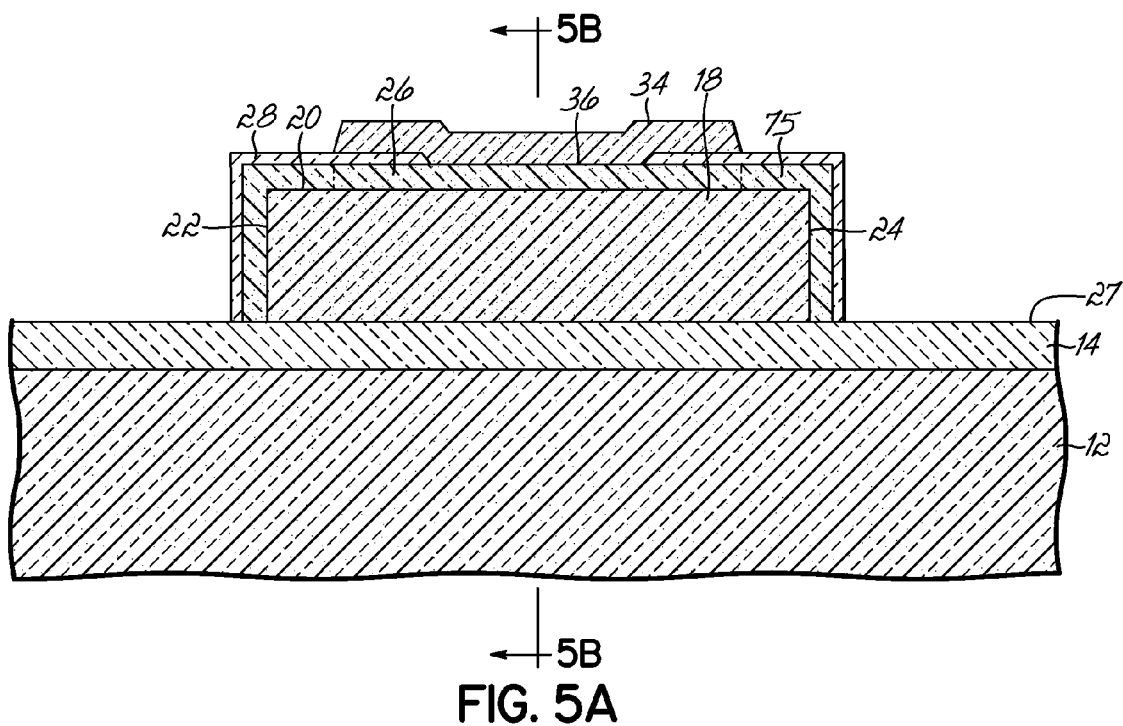
Figure 5B:
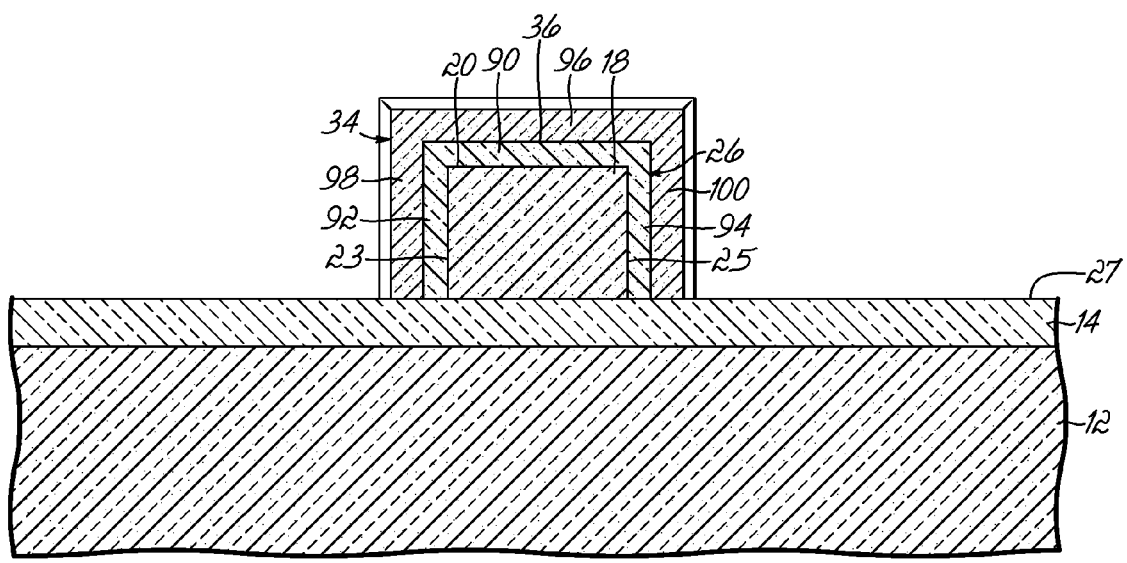
Figure 13A:
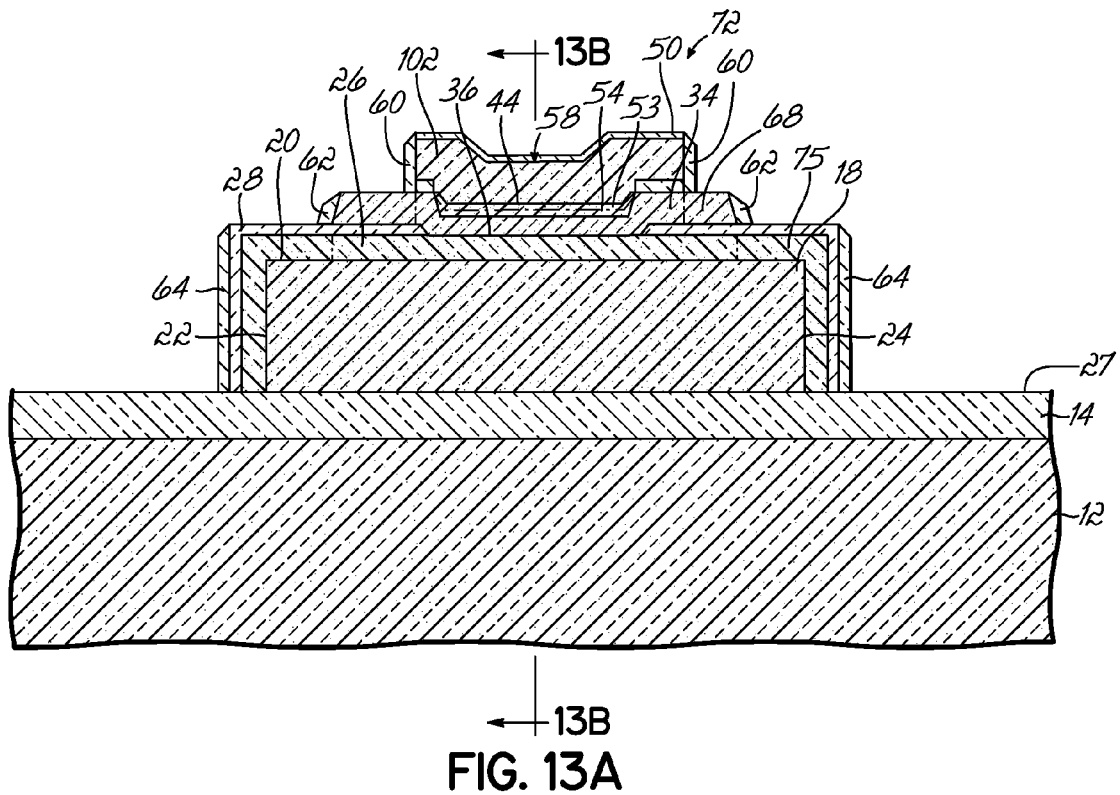
Figure 13B:
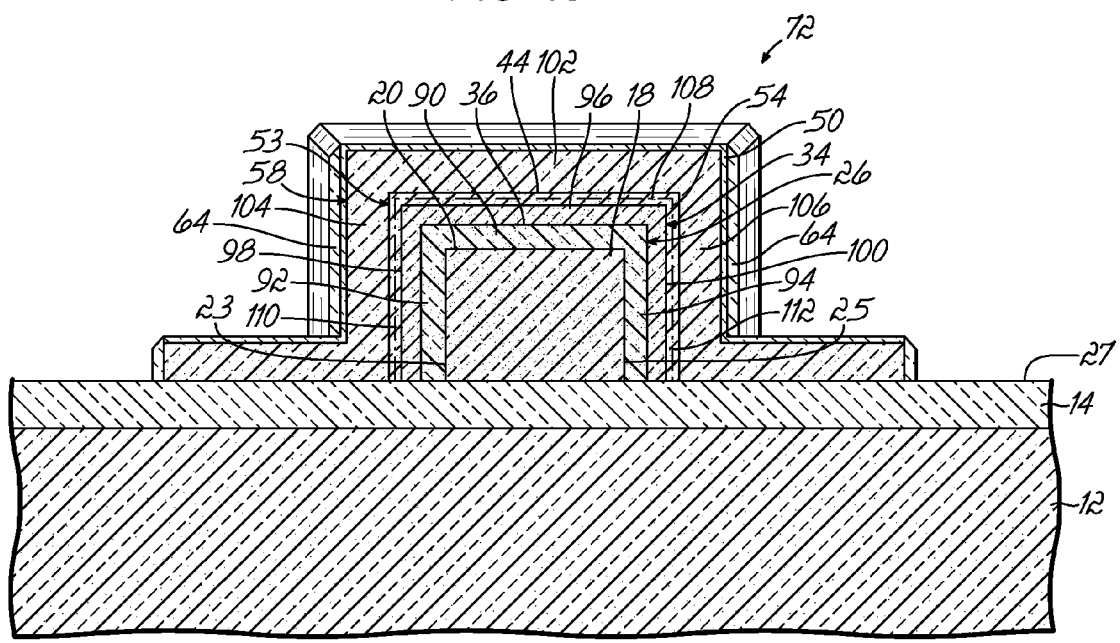

With reference to FIGS. 2A and 2B in which like reference numerals refer to like features in FIGS. 1A and 1B and at a subsequent fabrication stage, a collector region 26 of the bipolar junction transistor 72 (FIGS. 13A, 13B) is defined by forming a semiconductor layer on the fin structure 18. The semiconductor layer forming the collector region 26 may be formed by an epitaxial process, such as chemical vapor deposition (CVD) using a silicon source gas (e.g., silane). The semiconductor material constituting the collector region 26 is in situ doped during deposition with a concentration of an impurity having the same conductivity type as the fin structure 18 but doped to a lower concentration than the semiconductor material of the fin structure 18. The doping concentration in the constituent semiconductor material of the collector region 26 is selected to provide a desired collector junction doping profile according to design parameters for the bipolar junction transistor 72 (FIGS. 13A, 13B). Generally, the dopant concentration of the collector region 26 near the fin structure 18 may range from about $1\times10^{18}$ cm$^{-3}$ to about $1\times10^{20}$ cm$^{-3}$ to ensure relatively low series resistance with the fin structure 18 and the dopant concentration of the collector region 26 near the base region 34 (FIGS. 5A, 5B) may range from about $1\times10^{17}$ cm$^{-3}$ to about $1\times10^{18}$ cm$^{-3}$ to provide a low-leakage collector-base junction 36 (FIGS. 5A, 5B).

The collector region 26 comprises a top segment 90 and sidewall segments 92, 94 that are joined by the top segment 90 to define a continuous structure. The top segment 90 of the collector region 26 is coextensive (i.e., shares a border) with the top surface 20 of fin structure 18 and the sidewall segments 92, 94 are respectively coextensive with the sidewalls 23, 25 of fin structure 18. The sidewall segments 92, 94 extend from the top segment 90 along the sidewalls 23, 25 toward the top surface 27 of the buried insulating layer 14. The collector region 26 also includes segments that extend from the top segment 90 along the sidewalls 22, 24 toward the top surface 27 of the buried insulating layer 14.

Figure 3A:
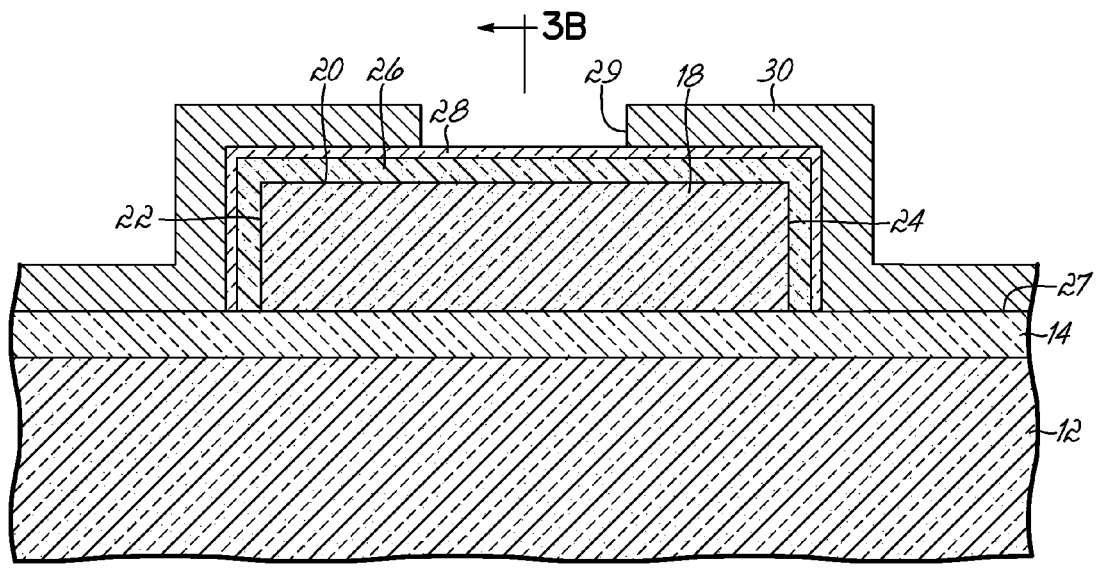
Figure 3B:
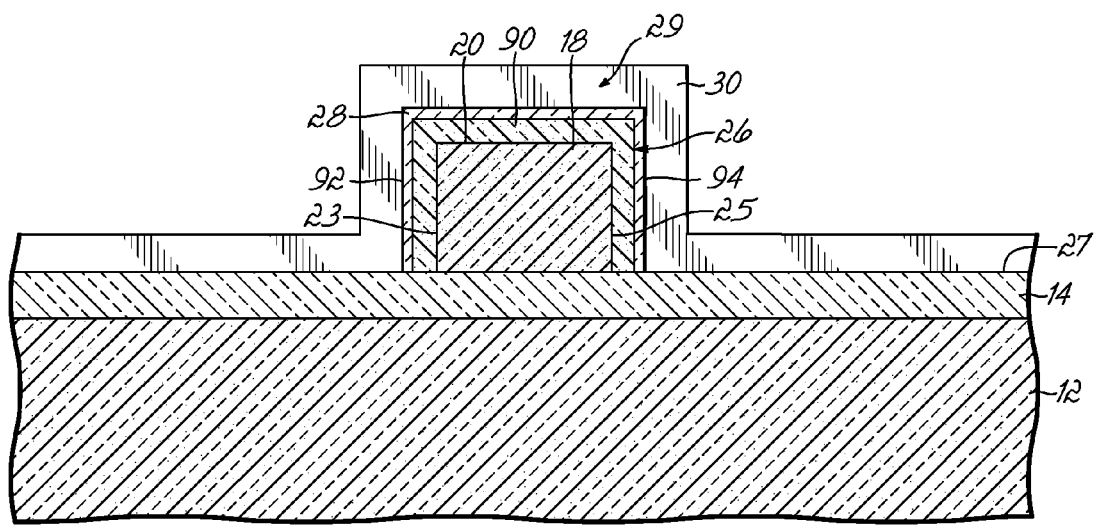

With reference to FIGS. 3A and 3B in which like reference numerals refer to like features in FIGS. 2A and 2B and at a subsequent fabrication stage, a thin layer 28 of a dielectric is formed on the collector region 26 to cap the constituent semiconductor material. The dielectric layer 28 may comprise, for example, oxide grown on the semiconductor material constituting the collector region 26 using a conventional wet or dry thermal oxidation process. The dielectric layer 28 covers the top segment 90 and sidewall segments 92, 94 of the collector region 26, which is disposed between the fin structure 18 and the dielectric layer 28.

The dielectric layer 28 is patterned by a conventional lithography and subtractive etching process. The lithography process applies a radiation-sensitive resist 30 on dielectric layer 28, exposes the resist 30 to a pattern of radiation (e.g, light, x-rays, or an electron beam), and develops the latent transferred pattern in the exposed resist 30 to define a representative opening 29 that extends across the top surface 20 and along the sidewalls 23, 25 of fin structure 18. Thus, the opening 29 extends across the top segment 90 and along the sidewall segments 92, 94 of the collector region 26.

Figure 4A:
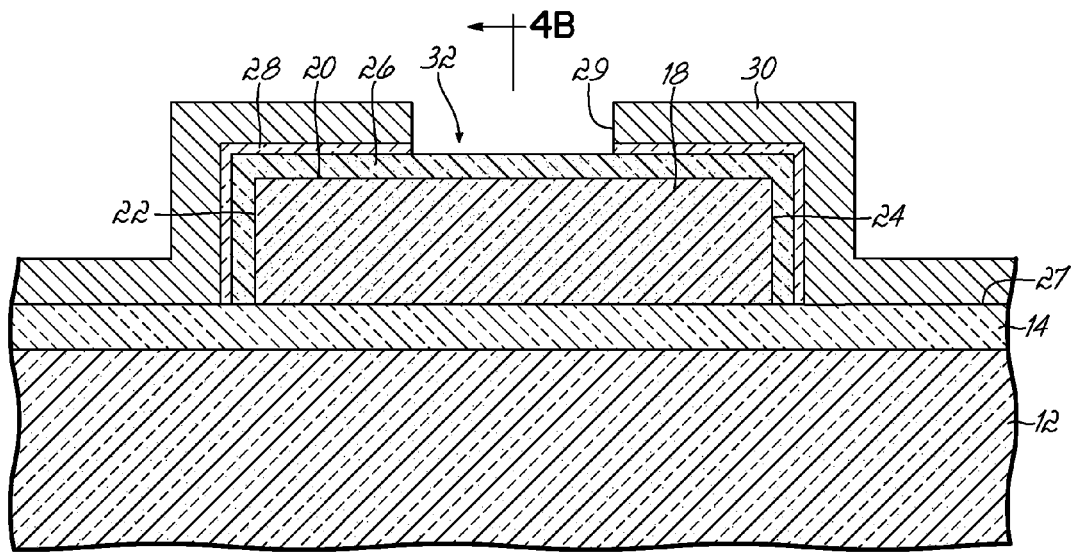
Figure 4B:
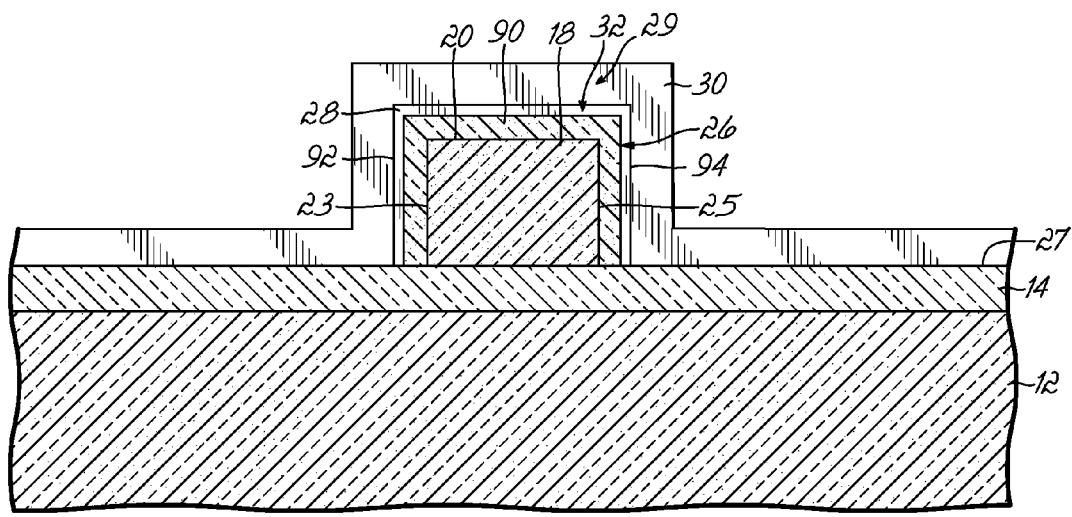

With reference to FIGS. 4A and 4B in which like reference numerals refer to like features in FIGS. 3A and 3B and at a subsequent fabrication stage, the subtractive etching process, which may be an anisotropic dry etch process like reactive ion etching (RIE) or plasma etching, transfers the pattern in the resist 30 to the dielectric layer 28. The subtractive etching process defines a base opening 32 to the collector region 26 by partially removing unmasked areas of dielectric layer 28 registered with the opening 29 in the patterned resist 30, which serves as an etch mask. The subtractive etching process, which relies on an etchant chemistry that removes the constituent material of the dielectric layer 28 selective to the semiconductor material constituting collector region 26, stops on the constituent semiconductor material of collector region 26. The dielectric layer 28 includes peripheral regions that overlap with the buried insulating layer 14 peripherally of the fin structure 18.

Base opening 32 extends across the top surface 20 and along the sidewalls 23, 25 of the fin structure 18. Thus, the base opening 32 extends across the top segment 90 and along the sidewall segments 92, 94 of the collector region 26. The top segment 90 and sidewall segments 92, 94 of the collector region 26 are exposed through the base opening 32 and are free of coverage by the dielectric layer 28, which has edges that peripherally bound the base opening 32.

Figure 11A:
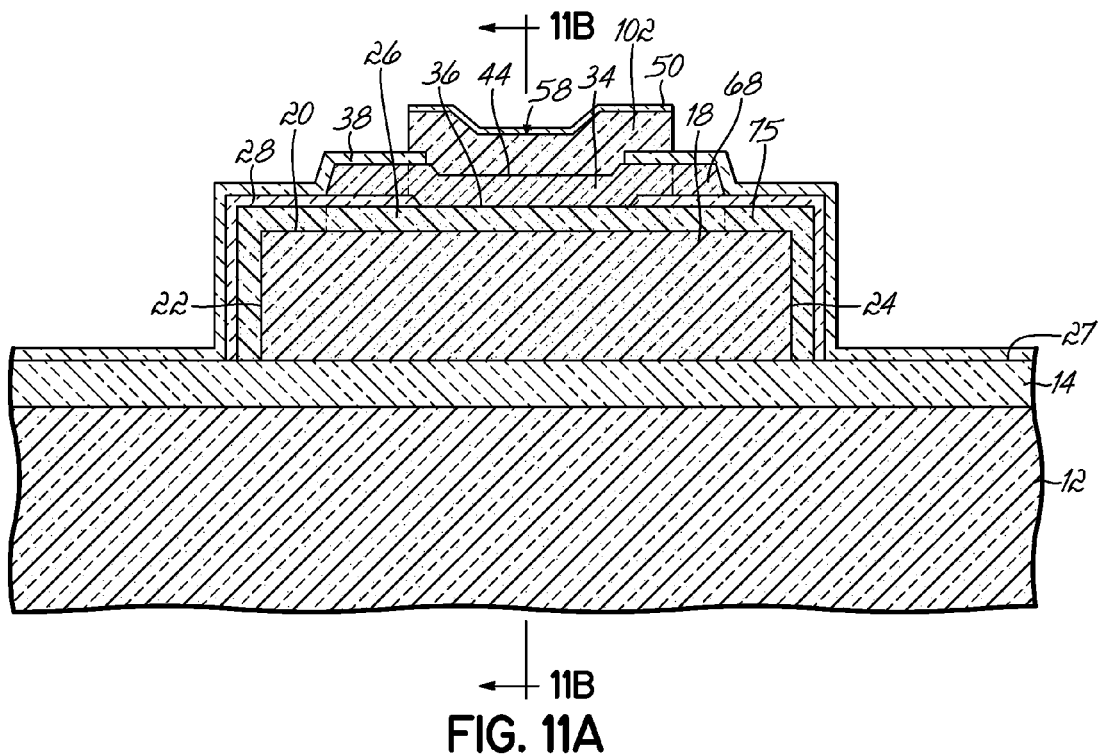

With reference to FIGS. 5A and 5B in which like reference numerals refer to like features in FIGS. 4A and 4B and at a subsequent fabrication stage, the patterned resist 30 (FIGS. 4A, 4B) is removed using a conventional solvent stripping process or by ashing. A base region 34 of the bipolar junction transistor 72 (FIGS. 13A, 13B) is then formed by a selective epitaxial growth process with in situ impurity doping that fills the base opening 32 with an impurity-doped semiconductor material, such as silicon or a silicon-containing semiconductor material. Specifically, the semiconductor material forming the base region 34 is doped with an impurity having an opposite conductivity type to collector region 26. For example, the dopant concentration of the base region 34 may be graded from about $1\times10^{17}$ cm$^{-3}$ near the collector region 26 to about $5\times10^{18}$ cm$^{-3}$ near the emitter region 58 (FIGS. 11A,B). A collector-base junction 36 is defined across the interface or boundary shared by the coextensive portions of the collector region 26 and base region 34. The impurity implanted to dope the semiconductor material of the base region 34 may have, for example, a p-conductivity type (e.g., boron).

The semiconductor material forming the base region 34 is doped with an impurity having an opposite conductivity type to collector region 26. The semiconductor material of the collector region 26 may be characterized by an n-type conductivity that exhibits a higher concentration of electrons than holes so that electrons are majority carriers and dominate the electrical conductivity of the material. The semiconductor material of the base region 34 may be characterized by a p-type conductivity that exhibits a higher concentration of holes than electrons so that holes are majority carriers and dominate the electrical conductivity of the material. Alternatively, the conductivity types may be reversed.

In one embodiment, the silicon-containing semiconductor material constituting the base region 34 may be an impurity doped silicon-germanium alloy ($Si_xGe_{1-x}$) in which the silicon atomic concentration ranges from about 65% to about 90% and the germanium atomic concentration ranges from about 10% to about 35%. The $Si_xGe_{1-x}$ may be deposited using any conventional epitaxial growth method capable of growing a SiGe alloy with in situ doping that is substantially free from defects, i.e., misfit and threading dislocations. An illustrative example of such an epitaxial growth process capable of growing substantially defect free films is a low-pressure chemical vapor deposition (LPCVD) process using silane ($SiH_4$) and germane ($GeH_4$) as reactant gasses and conducted at a relatively low process temperature.

Base region 34 is physically separated from the fin structure 18 by the collector region 26. Base region 34 has a top segment 96 that is coextensive with the top segment 90 of collector region 26 and sidewall segments 98, 100 that are respectively coextensive with the sidewall segments 92, 94 of collector region 26. The sidewall segments 98, 100 are joined by the top segment 96. The base region 34 extends across the top surface 20 and along the sidewalls 23, 25 of the fin structure 18. Thus, the base region 34 contacts the top segment 90 and sidewall segments 92, 94 of the collector region 26. The collector-base junction 36 is defined across the coextensive, contacting surface areas of the doped semiconductor material of the collector region 26 having one conductivity type and the doped semiconductor material of the base region 34 having the opposite conductivity type. The collector and base regions 36, 34 at least partially overlap to define the collector-base junction 36.

The periphery of the base region 34, which is designated by the lateral extent of the base opening 32 and the process forming the base region 34, is selected such that a contact pad 75 of the collector region 26 extends laterally of the periphery of the base region 34. The contact pad 75 is not overlapped by the base region 34 and, thus, does not participate in forming the collector-base junction 36. The contact pad 75 is employed to electrically contact the collector region 26, as described below.

Figure 6A:
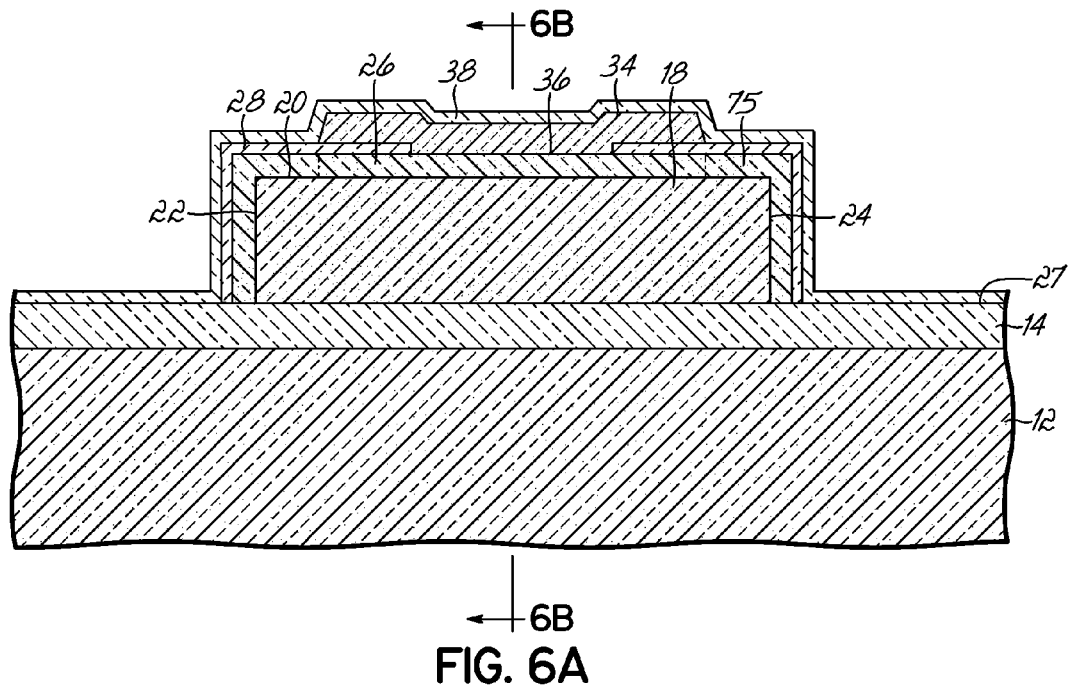
Figure 6B:
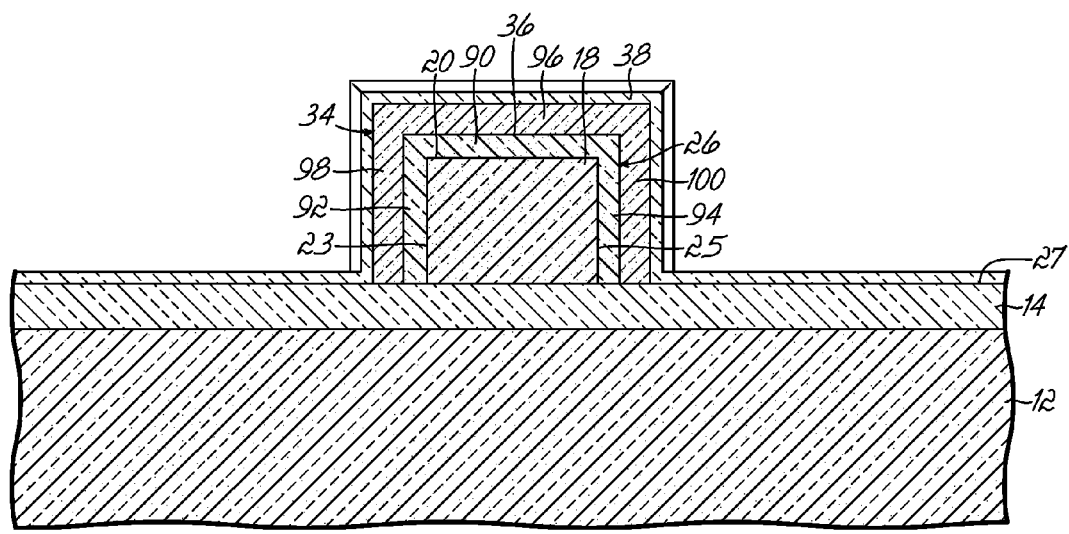

With reference to FIGS. 6A and 6B in which like reference numerals refer to like features in FIGS. 5A and 5B and at a subsequent fabrication stage, a layer 38 of a dielectric is conformally deposited across the fin structure 18. The dielectric in layer 38 may be silicon nitride ($Si_3N_4$) formed by a thermal CVD process like low pressure chemical vapor deposition (LPCVD) or by a plasma-assisted CVD process. The dielectric layer 38 extends across the top surface 20 and along the sidewalls 22, 23, 24, 25 of the fin structure 18.

Figure 7A:
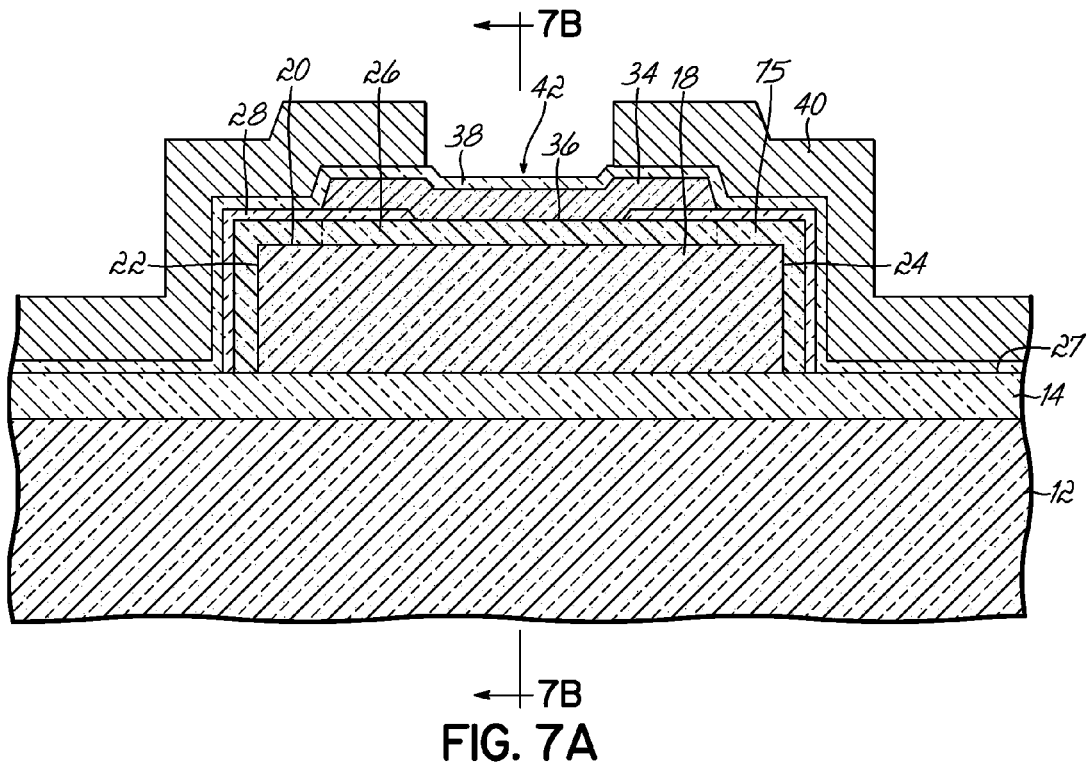
Figure 7B:
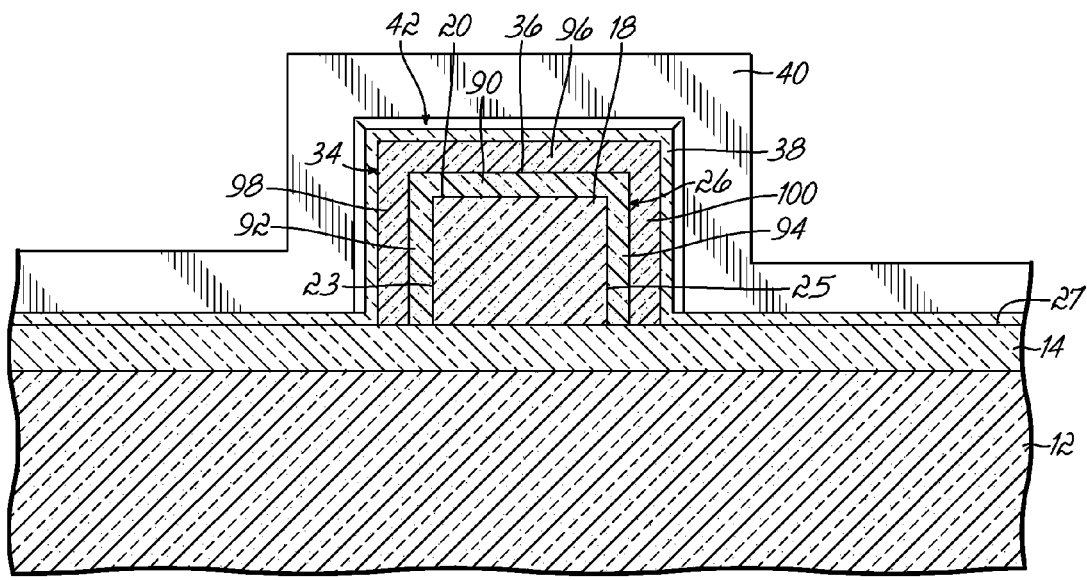

With reference to FIGS. 7A and 7B in which like reference numerals refer to like features in FIGS. 6A and 6B and at a subsequent fabrication stage, the dielectric layer 38 is patterned by a conventional lithography and subtractive etching process. The lithography process applies a radiation-sensitive resist 40 on dielectric layer 38, exposes the resist 40 to a pattern of radiation, and develops the latent transferred pattern in the exposed resist 40 to define an opening 42. The opening 42 extends across the top surface 20 and along the sidewalls 23, 25 of the fin structure 18.

Figure 8A:
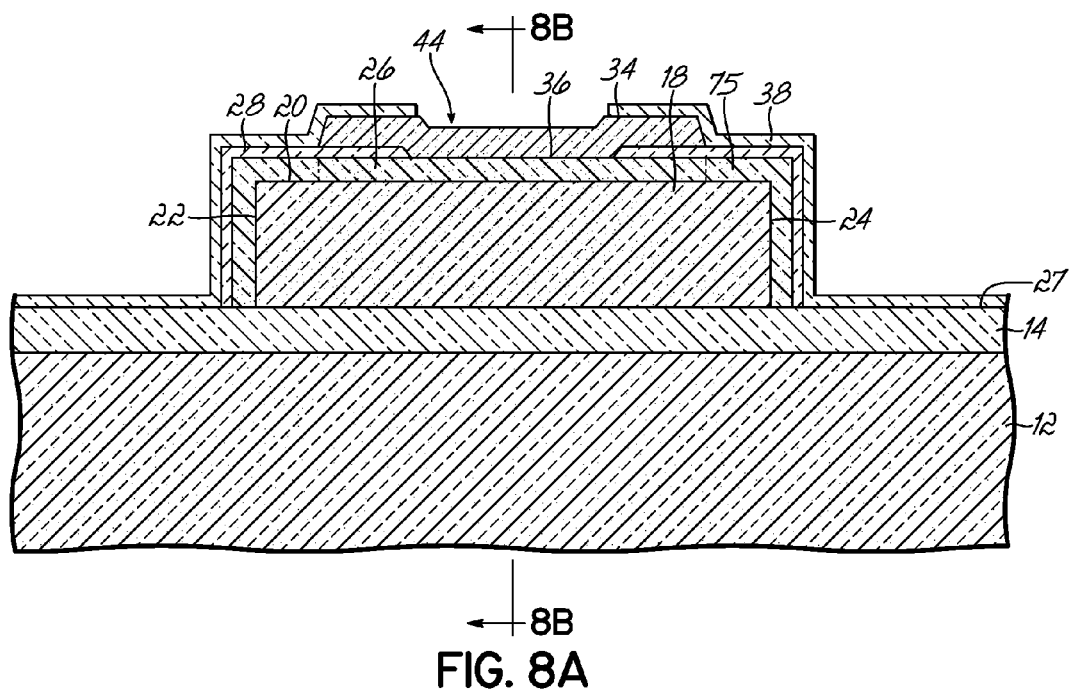
Figure 8B:
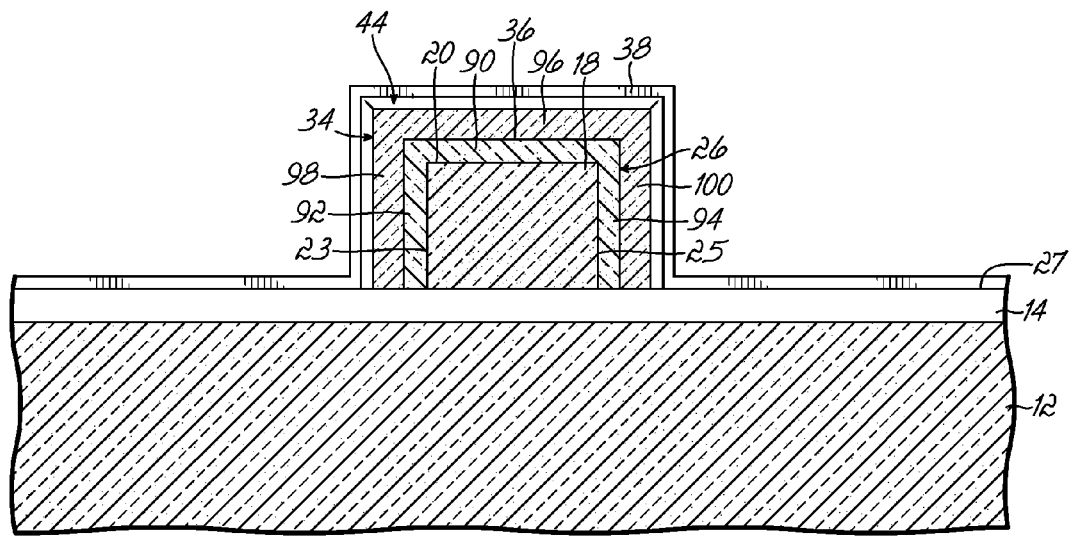

With reference to FIGS. 8A and 8B in which like reference numerals refer to like features in FIGS. 7A and 7B and at a subsequent fabrication stage, an emitter area 44 is defined across the top segment 96 and sidewall segments 98, 100 of the base region 34 by transferring the pattern in the resist 40 (FIGS. 7A, 7B) to the dielectric layer 38 using an anisotropic dry etch process like RIE or plasma etching. The dry etching process defines the emitter area 44 by removing an unmasked portion of dielectric layer 38 registered with the opening 42 in patterned resist 30, which operates as an etch mask. The dry etching process, which has an etchant chemistry that removes the constituent material of the dielectric layer 38 selective to the semiconductor material of the base region 34, stops on the constituent semiconductor material of base region 34. The top segment 96 and sidewall segments 98, 100 of base region 34 are exposed across the emitter area 44. The resist 40 (FIGS. 7A, 7B) is subsequently removed using a conventional solvent stripping process or by ashing.

Figure 9A:
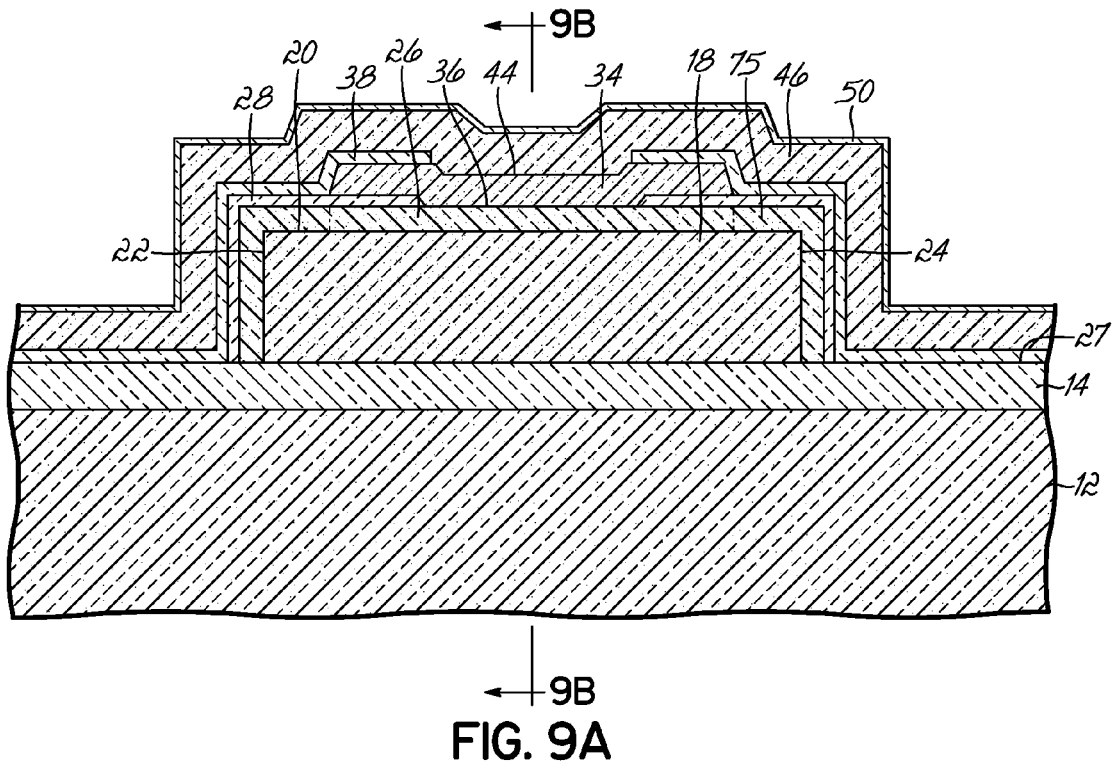
Figure 9B:
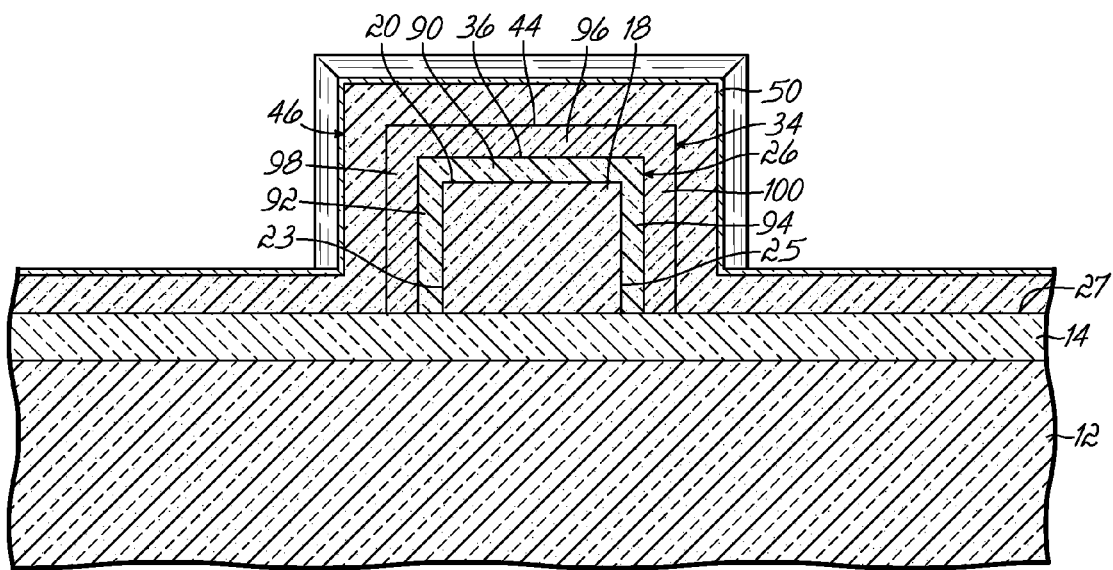

With reference to FIGS. 9A and 9B in which like reference numerals refer to like features in FIGS. 8A and 8B and at a subsequent fabrication stage, a layer 46 of a semiconductor material is formed on top surface 20 and sidewalls 22, 23, 24, 25 of the fin structure 18. The semiconductor layer 46 may be composed of polycrystalline silicon (i.e., polysilicon) deposited by a CVD process. Semiconductor layer 46 is doped during deposition with a concentration of an impurity having the same conductivity type as the semiconductor material of collector region 26 but the opposite conductivity type in comparison with the semiconductor material of base region 34. The semiconductor layer 46 is coextensive with the base region 34 across the emitter area 44, which is bounded peripherally by the encircling edges of the dielectric layer 38. A protective cap layer 50, which may comprise a layer of oxide deposited by a CVD process, is formed on the semiconductor layer 46.

Figure 10A:
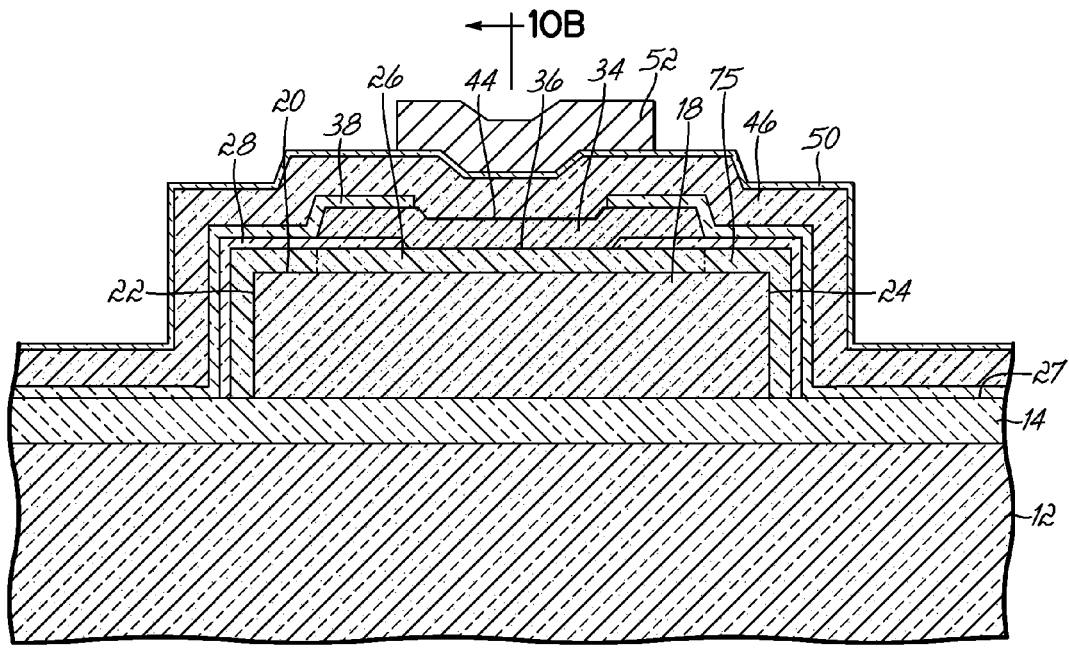
Figure 10B:
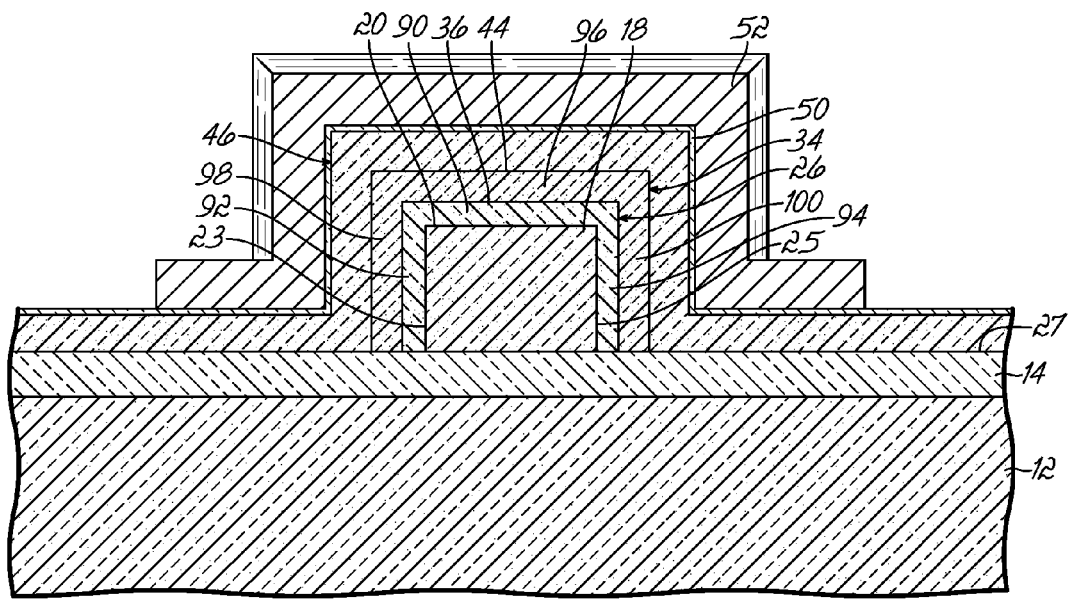

With reference to FIGS. 10A and 10B in which like reference numerals refer to like features in FIGS. 9A and 9B and at a subsequent fabrication stage, the semiconductor layer 46 and cap layer 50 are patterned by a conventional lithography and subtractive etching process. The lithography process applies a radiation-sensitive resist 52 on cap layer 50, exposes the resist 52 to a pattern of radiation, and develops the latent transferred pattern in the exposed resist 52 to define a residual strip or island of resist 52 covering a portion of the semiconductor layer 46 and cap layer 50. The residual island of resist 52 extends across the top surface 20 and along the sidewalls 23, 25 of the fin structure 18.

Figure 11B:
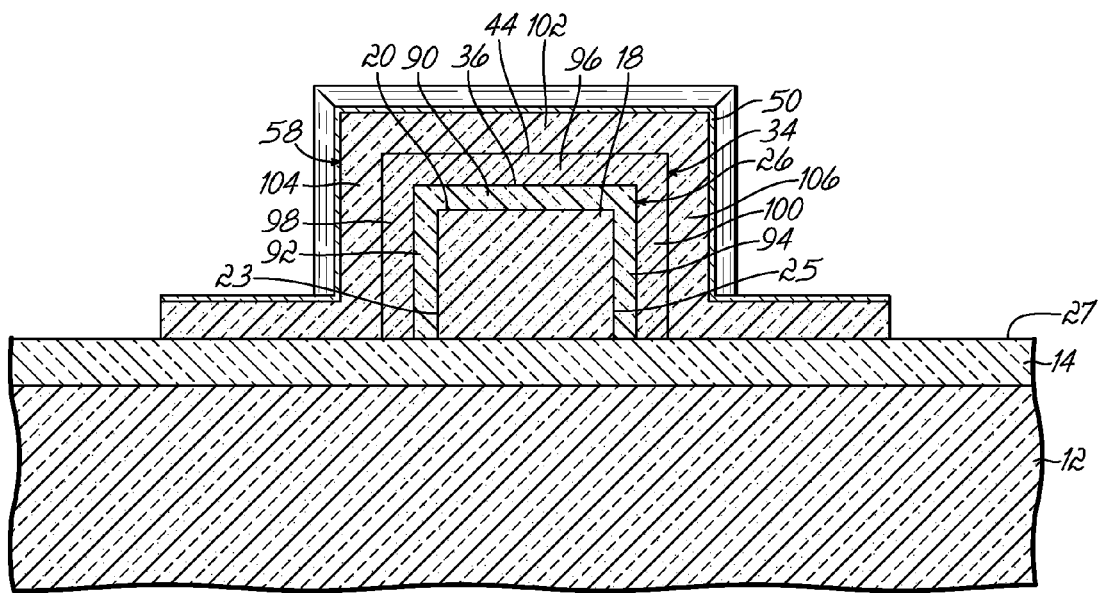

With reference to FIGS. 11A and 11B in which like reference numerals refer to like features in FIGS. 10A and 10B and at a subsequent fabrication stage, the subtractive etching process removes portions of the semiconductor layer 46 and cap layer 50 not masked by the residual island of resist 52. The portion of the semiconductor layer 46 masked during the subtractive etching process comprises an emitter region 58 of the bipolar junction transistor 72 (FIGS. 13A, 13B). The subtractive etching process includes one or more anisotropic dry etch processes, like RIE or plasma etching, that patterns the cap layer 50 using the resist 52 as an etch mask and then patterns the semiconductor layer 46 using the patterned cap layer 50 and resist 52 as an etch mask. The subtractive etching process, which may be conducted in a single etching step or multiple steps, stops on the dielectric layer 38. After the emitter region 58 is defined, the resist 52 (FIGS. 10A, 10B) is removed using solvent stripping or ashing.

The emitter region 58, which has a top segment 102 and sidewall segments 104, 106 joined by the top segment 102, is physically separated from the collector region 26 by the base region 34. The top segment 102 is coextensive with the top segment 96 of base region 34 and the sidewall segments 104, 106 are respectively coextensive with the sidewall segments 98, 100 of base region 34. The top segment 102 and sidewall segments 104, 106 of emitter region 58 extend adjacent to the top surface 20 and the sidewalls 23, 25 of the fin structure 18. Thus, the emitter region 58 extends across the top segment 96 and along the sidewall segments 98, 100 of the base region 34. The lateral extent of the emitter region 58, which is designated by the lateral extent of the resist 52, is selected such that the contact pad 68 of the base region 34 is outside of the perimeter or periphery of the emitter region 58.

Figure 12A:
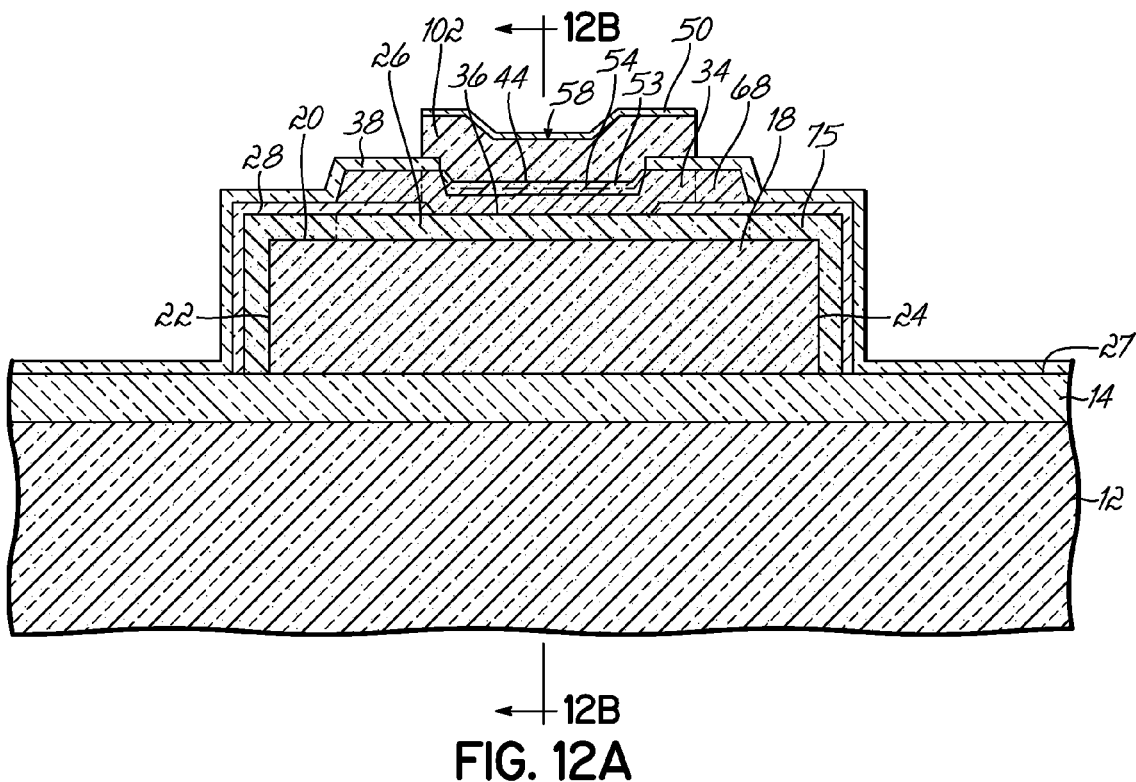
Figure 12B:
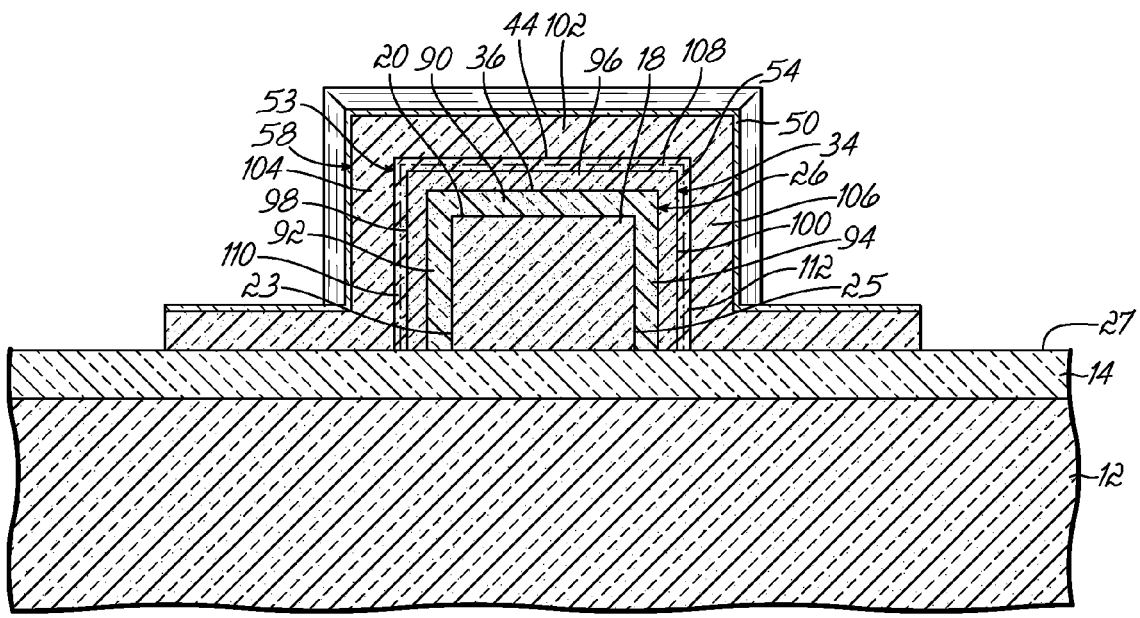

With reference to FIGS. 12A and 12B in which like reference numerals refer to like features in FIGS. 11A and 11B and at a subsequent fabrication stage, the SOI wafer 10 is annealed at a temperature and for a time that promotes impurity diffusion from the doped semiconductor material of the emitter region 58 into the base region 34 across the emitter region 58. The anneal may be performed in either a vacuum or inert environment, where an inert environment may comprise, for example, a non-reactive atmosphere of helium (He), argon (Ar), or nitrogen (N$_2$), and at a substrate temperature in the range of 950° C. to 1100° C. The volume of semiconductor material of the base region 34 receiving the diffused impurity is doped with a net impurity concentration that is graded across a zone 53 from one conductivity type (i.e., n-type) near the emitter region 58 to the opposite conductivity type (i.e., p-type) of the base region 34. An emitter-base junction 54 is defined by the locus of points or transition between conductivity types in the graded zone 53 for which the net doping concentration is null or zero. The bulk of the emitter region 58 may have a dopant concentration of about $5\times10^{19}$ cm$^{-3}$ to about $5\times10^{20}$ cm$^{-3}$. The emitter-base junction 43 is generally defined by the at least partial overlap between coextensive portions of the emitter region 78 and the base region 48.

The emitter-base junction 54, which is defined at the location of coextensive portions of the base region 34 and emitter region 58 for which the net doping concentration is null or zero, is collectively defined by a top segment 108 and sidewall segments 110, 112 joined by the top segment 108. Hence, the emitter-base junction 54 comprises a three-dimensional, non-planar feature of the bipolar junction transistor 72. The emitter-base junction 54 (as well as the collector, base, and emitter regions 26, 34, 58 and collector-base junction 36) has a length slightly greater than the height of fin structure 18 at sidewall 23, plus the width of fin structure 18 across the top surface 20, plus the height of fin structure 18 at sidewall 25. The base region 34, emitter region 58, and emitter-base junction 54 are a continuous region of semiconductor material. The top segment 108 and sidewall segments 110, 112 of the emitter-base junction 54 extend adjacent to the top surface 20 and the sidewalls 23, 25 of the fin structure 18.

With reference to FIGS. 13A and 13B in which like reference numerals refer to like features in FIGS. 12A and 12B and at a subsequent fabrication stage, insulating spacers 60 are formed on the peripheral edges of the emitter region 58 and insulating spacers 62 are formed on the peripheral edges of the base region 34 by a conventional film deposition and anisotropic etching process. Dielectric layer 38, which may be composed of the same material as the film (e.g., nitride) deposited to form the spacers, is also anisotropically etched during spacer formation. Insulating spacers 64 are also formed on the vertical surfaces flanking the fin structure 18 as an artifact of the process forming spacers 60, 62. Forming the spacers 60, 62, 64 concludes the fabrication of the bipolar junction transistor 72.

The anisotropic etching process removes portions of the dielectric layer 38 to expose the peripheral contact pad 68 of the base region 34. The contact pad 68 is not overlapped by the emitter region 58 and, thus, does not participate in forming the emitter-base junction 54. The contact pad 68 is used to electrically contact the base region 34, as described below.

Although illustrated as having an NPN doping configuration for the collector region 26, base region 34, and emitter region 58, the fabrication of the bipolar junction transistor 72 may be modified to provide a PNP doping configuration for the collector region 26, base region 34, and emitter region 58 as understood by a person having ordinary skill in the art.

Figure 14A:
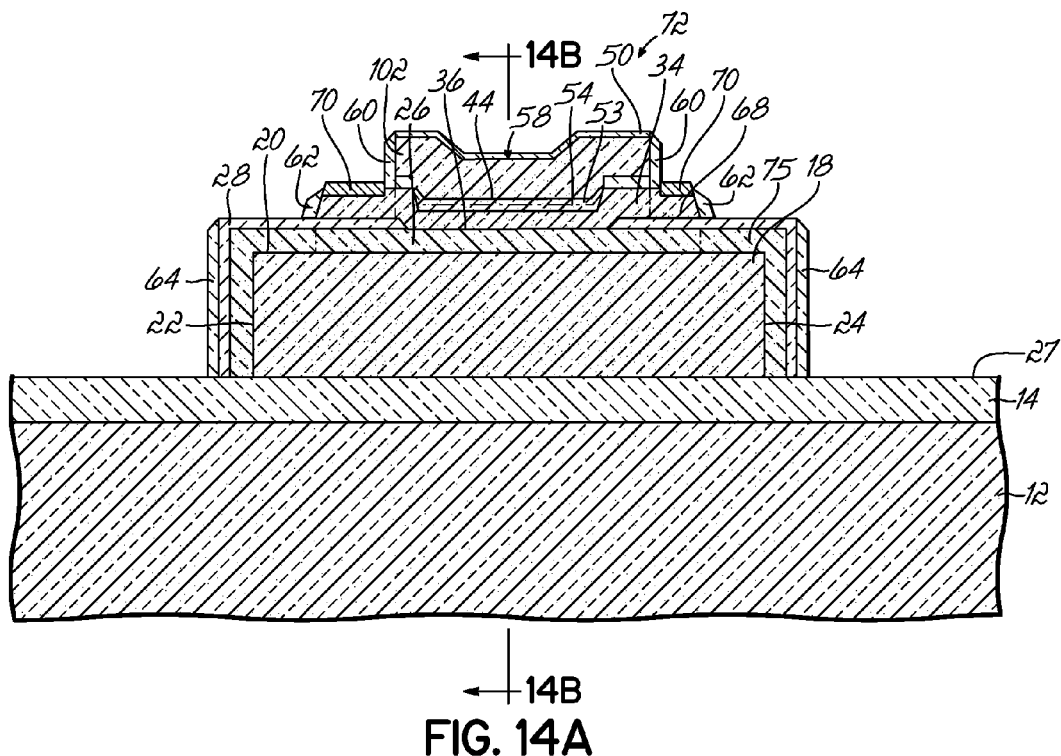
Figure 14B:
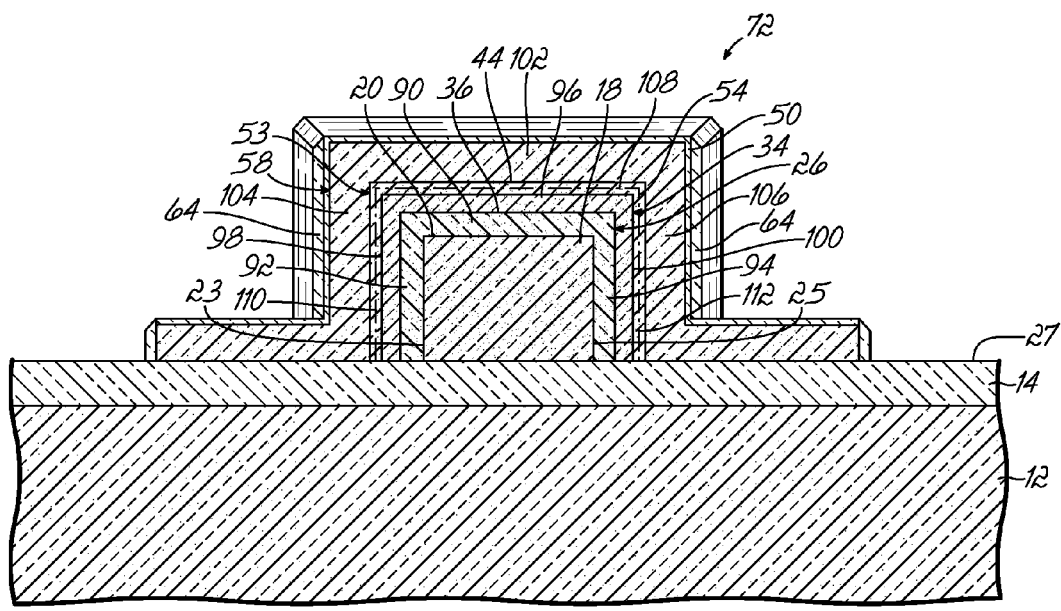

With reference to FIGS. 14A and 14B in which like reference numerals refer to like features in FIGS. 13A and 13B and at a subsequent fabrication stage, a contact region 70 is formed on a top surface of the contact pad 68 of the base region 34. The contact region 70 may be, for example, self-aligned silicide or salicide contacts formed using a conventional silicidation or salicidation process well known to a person having ordinary skill in the art, which includes forming a layer of refractory metal, such as titanium (Ti), cobalt (Co), tungsten (W), or nickel (Ni), on the silicon-containing semiconductor material comprising the base region 34 and heating the metal/silicon-containing material stack by, for example, a rapid thermal annealing process to transform the stack to form a silicide. Thereafter, any non-reacted refractory metal is removed utilizing a conventional wet chemical etchant. The silicidation may be conducted in an inert gas atmosphere or in a nitrogen-rich gas atmosphere. Contact region 70 provides a low resistance contact to the semiconductor material constituting the base region 34. Cap layer 50 protects emitter region 58 during formation of the contact region 70.

Figure 15:
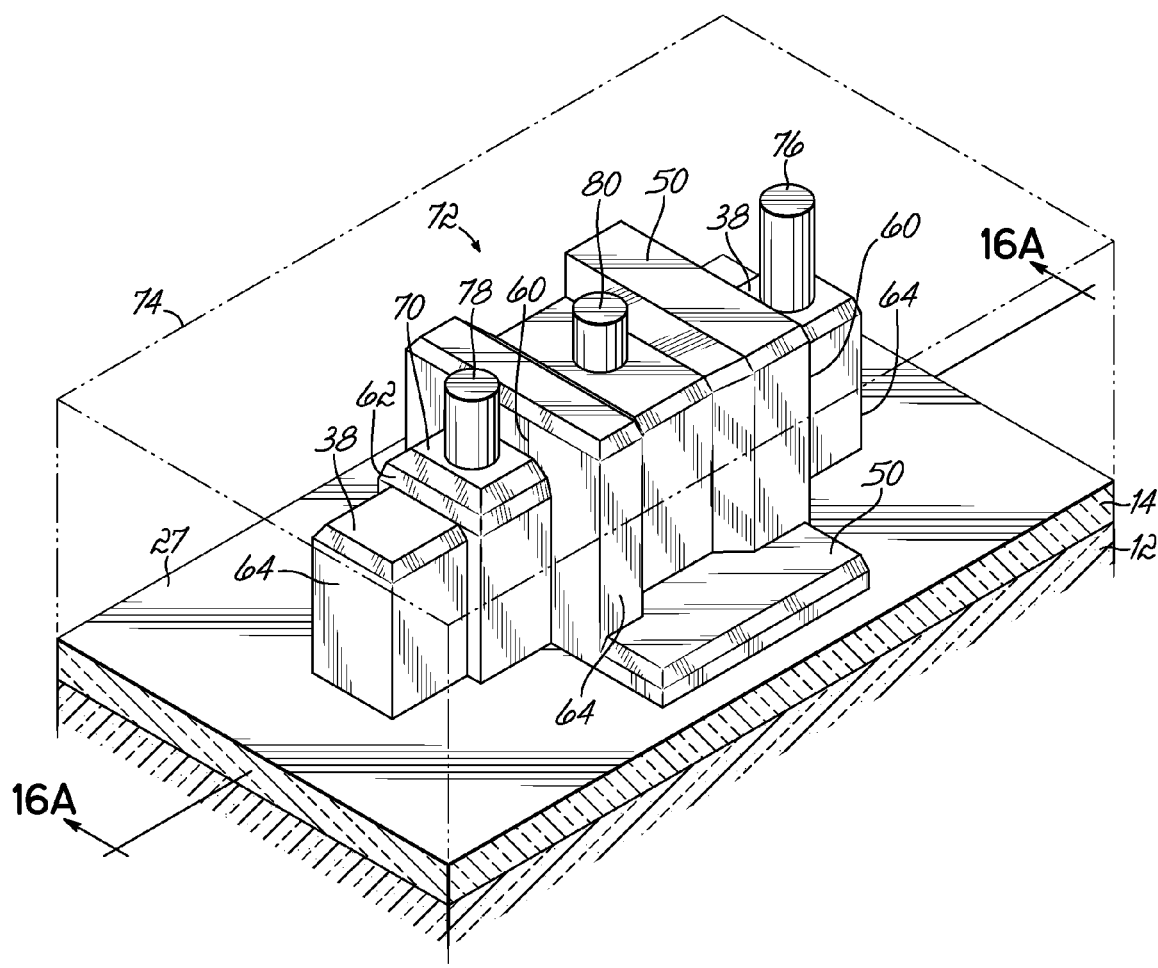
FIG. 15 is an isometric view of the substrate portion of FIG. 14 after contacts are formed to the emitter, base, and collector regions.
Figure 16A:
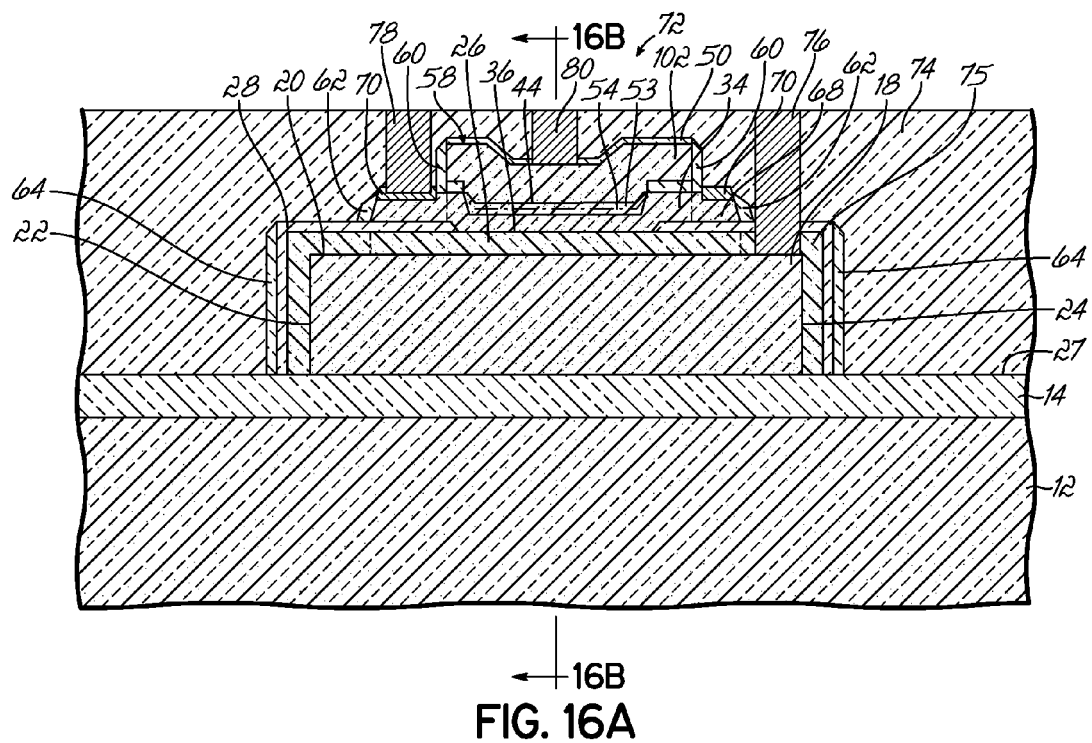
FIG. 16A is a cross-sectional view taken generally along line 16A-16A in FIG. 15.
Figure 16B:
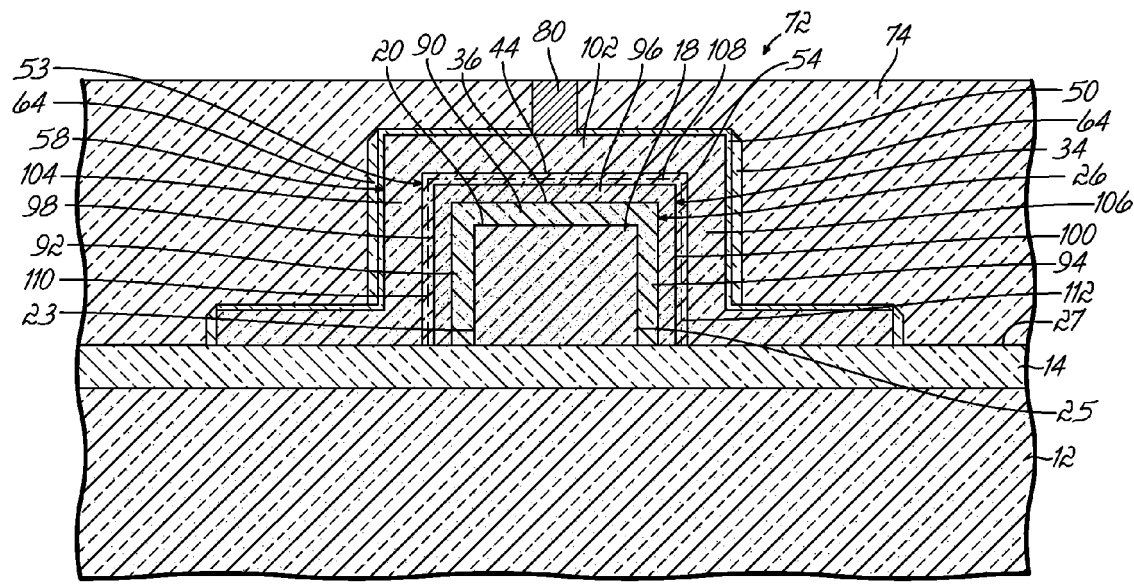
FIG. 16B is a cross-sectional view taken generally along line 16B-16B in FIG. 16A.

With reference to FIGS. 15, 16A, and 16B in which like reference numerals refer to like features in FIGS. 14A and 14B and at a subsequent fabrication stage, a blanket layer 74 of an insulating material is applied across the bipolar junction transistor 72 and planarized by a conventional planarization process like chemical mechanical planarization (CMP). The insulating material of the blanket layer 74, which provides an interlayer dielectric for contact formation, may be composed of a spin-on glass (SOG) material applied by coating the SOI wafer 10 with the SOG material in liquid form, spinning the SOI wafer 10 at high speeds to uniformly distribute the liquid on the surface by centrifugal forces, and baking at a low temperature to solidify the SOG material. Alternatively, the insulating material of the blanket layer 74 may include multiple coatings of different dielectric materials as understood by a person having ordinary skill in the art.

Another particularly advantageous dielectric material that may be employed to form the insulating material of the blanket layer 74 is diamond-like carbon or diamond deposited by a thermal or plasma CVD process, which may improve heat dissipation because of diamond's relatively high thermal conductivity. This ability to dissipate heat may be important for effectively cooling the bipolar junction transistor 72 when the integrated circuit is powered and operating. Other dielectric materials having a high thermal conductivity and a low electrical conductivity may be employed to form the insulating material of the blanket layer 74 as understood by a person having ordinary skill in the art.

The blanket layer 74 of insulating material is then lithographically patterned in a conventional manner to form via holes to the collector region 26, base region 34, and emitter region 58. A conductive material is deposited into the via holes using conventional processing, such as CVD or plating to form electrical contacts 76, 78, 80 that extend to the collector region 26, base region 34, and emitter region 58, respectively. Conductive materials suitable for the contacts 76, 78, 80 may include, but are not limited to, metals such as tungsten, copper, aluminum, silver, gold, and alloys thereof.

Electrical contact 76 extends through the blanket insulating layer 74 and the dielectric layer 28 to the depth of the collector region 26 and is electrically coupled with the peripheral contact pad 75 of the collector region 26. The contact pad 75 of collector region 26 is not overlapped by the base region 34 and, thus, does not participate in forming the emitter-base junction 54. Contact pad 75 of collector region 26 also extends laterally of the emitter region 58 so that the emitter region 58 does not occlude the path for establishing the contact 76. Electrical contact 78 extends through the blanket insulating layer 74 to the depth of the peripheral contact pad 68 of the base region 34 and is electrically coupled with the contact region 70 of, for example, salicide. Electrical contact 80 extends through the blanket insulating layer 74 and the cap layer 50 to the depth of the emitter region 58 and is electrically coupled with the emitter region 58.

As best shown in FIG. 16B, the collector region 26, base region 34, and emitter region 58, as well as junctions 36, 54, of the bipolar junction transistor 72 each wrap about the top surface 20 and sidewalls 23, 25 of the fin structure 18 so that each extends about three sides of the fin structure 18 in a non-planar construction. The emitter-base junction 54 also wraps about the top surface 20 and sidewalls 23, 25 of the fin structure 18, which significantly increases the bipolar junction area and current per unit area of silicon real estate on the SOI wafer 10. Instead of forming the collector region 26, base region 34, emitter region 58 and emitter-base junction 54 on planar surfaces, as done during the fabrication of conventional bipolar junction transistors, bipolar junction transistor 72 utilizes the relatively large surface area on fin structure 18 of semiconductor material to provide a three-dimensional, non-planar device structure. As a result, the emitter-base junction 54 is not limited by the planar surface area of a conventional handle substrate. The collector region 26, base region 34, and emitter region 58 of the bipolar junction transistor 72 have a tiered configuration for the respective structural peripheral edges that facilitates forming contacts 76, 78, 80 by exposing contact pad 68 of the base region 34 peripherally of the emitter region 58 and by exposing contact pad 75 of the collector region 26 peripherally of the base region 34.

References herein to terms such as "vertical", "horizontal", etc. are made by way of example, and not by way of limitation, to establish a frame of reference. The term "horizontal" as used herein is defined as a plane parallel to the top surface 20 of fin structure 18, regardless of its actual three-dimensional spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a semiconductor device structure on an insulating layer, the method comprising:
    forming a semiconductor body having a top surface and sidewalls extending from the top surface toward the insulating layer;
    forming a first region composed of a first semiconductor material with a first conductivity type that is disposed on the top surface and the sidewalls of the semiconductor body; and
    forming a second region composed of a second semiconductor material with a second conductivity type that is disposed on the top surface and the sidewalls of the semiconductor body with the first region positioned between the second region and the semiconductor body to define a first junction between the first and second regions that extends across the top surface and along the sidewalls of the semiconductor body.

2. The method of claim 1 wherein forming the semiconductor body further comprises:
    patterning a continuous layer of monocrystalline semiconductor material carried on the insulating layer to form the sidewalls of the semiconductor body.

3. The method of claim 2 further comprising:
    thickening the continuous semiconductor layer before patterning to form the sidewalls of the semiconductor body.

4. The method of claim 1 further comprising:
    forming a third region that includes a third semiconductor material doped to have the first conductivity type and that is disposed on the top surface and the sidewalls of the semiconductor body with the first and second regions positioned between the third region and the semiconductor body such that the second and third regions define a second junction that extends across the top surface and along the sidewalls of the semiconductor body.

5. The method of claim 1 wherein forming the second region further comprises:

depositing a dielectric layer on the first region;

forming an opening in the dielectric layer extending to the first region along the top surface and the sidewalls of the semiconductor body; and depositing the second semiconductor material within the opening.

6. The method of claim 5 wherein the second semiconductor material comprises a silicon-germanium alloy including a dopant having the second conductivity type, and depositing the second semiconductor material further comprises:

epitaxially growing the silicon-germanium alloy within the opening as the second semiconductor material.

7. The method of claim 5 wherein the second semiconductor material comprises silicon including a dopant having the second conductivity type, and depositing the second semiconductor material further comprises:

epitaxially growing the silicon within the opening as the second semiconductor material.

8. The method of claim 1 wherein forming the second region further comprises:

thermally diffusing the first and second regions to define the first junction.

9. The method of claim 1 further comprising:

covering the semiconductor body, the first region, and the second region with a blanket layer including diamond.

10. The method of claim 9 further comprising:

forming first and second contact vias respectively extending through the blanket layer to the first and second regions; and filling the first and second contact vias with a conductive material to establish respective electrical contacts with the first and second regions.

* * * * *